(12) United States Patent
Pan et al.

(10) Patent No.: US 7,332,946 B2
(45) Date of Patent: Feb. 19, 2008

(54) POWER SUPPLY VOLTAGE DETECTION CIRCUITRY AND METHODS FOR USE OF THE SAME

(75) Inventors: Dong Pan, Boise, ID (US); Feng (Dan) Lin, Boise, ID (US); Paul A Silvestri, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/501,673

(22) Filed: Aug. 8, 2006

(65) Prior Publication Data

US 2007/0057716 A1    Mar. 15, 2007

Related U.S. Application Data

(63) Continuation of application No. 10/886,771, filed on Jul. 7, 2004, now Pat. No. 7,148,742.

(51) Int. Cl.
*H03L 7/00* (2006.01)
(52) U.S. Cl. ...................................... 327/143
(58) Field of Classification Search ................ 327/142, 327/143, 198, 530, 534, 535, 539
See application file for complete search history.

(56) References Cited

U.S. PATENT DOCUMENTS

| | | | |
|---|---|---|---|
| 5,477,176 A | 12/1995 | Chang et al. | |
| 5,530,398 A | 6/1996 | Shamlou et al. | |
| 5,610,506 A | 3/1997 | McIntyre | |
| 5,818,292 A | 10/1998 | Slemmer | |
| 5,867,047 A * | 2/1999 | Kraus | 327/143 |
| 6,642,776 B1 * | 11/2003 | Micheloni et al. | 327/539 |
| 6,661,713 B1 | 12/2003 | Kuo | |
| 6,677,808 B1 | 1/2004 | Sean et al. | |
| 6,690,228 B1 | 2/2004 | Chen et al. | |
| 6,707,707 B2 | 3/2004 | Marr | |
| 7,116,139 B2 * | 10/2006 | Mitchell | 327/142 |
| 7,208,987 B2 * | 4/2007 | McClure | 327/143 |

FOREIGN PATENT DOCUMENTS

| | | |
|---|---|---|
| EP | 0 713 166 B1 | 9/1999 |
| EP | 0 676 857 B1 | 1/2002 |

* cited by examiner

*Primary Examiner*—Jeffrey Zweizig
(74) *Attorney, Agent, or Firm*—Ropes & Gray LLP; Michael J. Chasan

(57) ABSTRACT

Power detection circuitry that provides a substantially constant trip-point is provided. The circuitry is immune to temperature and process variations, thus preventing premature or delayed enablement of utilization circuitry (e.g., memory). In addition, the trip-point remains constant during both slow and fast power up and power down conditions. This may be accomplished with the use of bandgap reference circuitry that provides a stable bandgap reference voltage when operating in its stable operating region. The bandgap circuitry operates in conjunction with startup circuitry, which enables the bandgap circuitry to operate in its non-stable operating region. When in the non-stable region, the bandgap circuitry provides a source voltage as the reference voltage until the source voltage begins to approach the bandgap voltage, at which point the bandgap circuitry provides the stable bandgap reference voltage as the reference voltage.

13 Claims, 9 Drawing Sheets

POWER SUPPLY VOLTAGE DETECTION CIRCUITRY AND METHODS FOR USE OF THE SAME

This is a continuation of U.S. patent application Ser. No. 10/886,771, filed Jul. 7, 2004, now U.S. Pat. No. 7,148,742, which is incorporated by reference herein in its entirety.

BACKGROUND OF THE INVENTION

This invention relates to circuitry that provides a reference voltage, and more particularly relates to reference voltage circuitry that is implemented in integrated circuitry.

In general, voltage detection circuitry prevents utilization circuitry (e.g., memory) from operating when the power supply voltage is too low for proper operation. At power-up (e.g., start up) the voltage detection circuitry suppresses operation of the utilization circuitry until the supply voltage reaches a predetermined voltage. When the supply voltage reaches the predetermined voltage, the voltage detection circuitry may enable the utilization circuitry by asserting, for example, a POWER-UP ENABLE signal. Likewise, during power-down, the voltage detect circuitry can de-assert the POWER-UP ENABLE signal when the supply voltage falls below the predetermined voltage, thereby disabling the utilization circuitry.

The point at which the voltage detection circuitry changes the state of the POWER-UP ENABLE signal is sometimes referred to as the trip-point. During power-up (sometimes referred to herein as ramp-up), the trip-point occurs when the supply voltage exceeds a predetermined voltage. Similarly, during power-down (sometimes referred to herein as ramp-down), the trip-point occurs when the supply voltage falls below the predetermined voltage.

In conventional voltage detection circuitry, such as that shown FIG. 1, the trip-point corresponds to when transistor 120 turns ON and OFF. For example, during power-up, the POWER-UP ENABLE signal goes HIGH when transistor 120 turns ON. POWER-UP ENABLE goes high because the voltage at the drain of transistor 120 (Node A) is pulled to ground when transistor 120 is turned ON. This LOW signal is then inverted by inverter 130 to provide a HIGH POWER-UP ENABLE signal.

A problem with circuitry 100 (of FIG. 1) is that the point at which transistor 120 turns ON is subject to temperature and process variations. Process variation refers to the variance of one circuit to the next. For example, when transistors are fabricated, the threshold voltage may not be uniform for all transistors. One threshold voltage may be 0.7 volts, whereas another threshold voltage may be 0.8 volts. Other components, such as resistors, typically vary in resistance and equivalent series inductance. Thus, when circuitry 100 is constructed, the turn ON point of transistor 120 may vary from one circuit to the next. Moreover, changes in temperature can cause the trip-point of a particular circuit to vary. FIG. 2 shows how trip-points can vary from one voltage detection circuit to another and how temperature changes can affect the trip point for a particular voltage detection circuit.

This gross variance in trip-points is undesirable and can potentially result in permanent damage to utilization circuitry. For example, if the trip-point occurs before the supply voltage reaches a predetermined voltage, this may force the utilization circuitry to draw excessive current to compensate for being enabled at too low a-voltage, potentially resulting in a circuit damaging current spike.

Therefore, it is an object of the invention to provide voltage detection circuitry that is insensitive to process and temperature variation.

It is also an object of the invention to provide voltage detection circuitry that has a substantially constant trip-point.

SUMMARY OF THE INVENTION

These and other objects of the invention are provided by voltage detection circuitry that utilizes bandgap circuitry to provide a substantially constant trip-point independent of temperature and process variations.

The bandgap circuitry according to the invention is an operational amplifier (OPAMP) based bandgap circuit capable of providing a substantially constant reference voltage for use in voltage detection circuitry. This substantially constant reference voltage is produced independent of temperature and process variations and provides an excellent foundation for providing a substantially constant trip-point. The trip-point may be attained by comparing the reference voltage to an input voltage derived, for example, from a voltage divider circuit. When the input voltage exceeds the stable reference voltage, the voltage detection circuitry may assert the POWER-UP ENABLE signal. The voltage detection circuitry may de-assert the POWER-UP ENABLE signal when the input signal falls below the stable reference voltage.

The stable reference voltage is generated by the OPAMP's bandgap voltage. As is known in the art, the bandgap voltage is derived from the difference in emitter voltage of two BJT transistors being used in combination with resistors and a differential amplifier. More specifically, one of the BJT transistors has a larger emitter area than the other BJT. When the same level of current is applied to both BJT transistors, the transistor with the smaller emitter area produces a larger base emitter voltage than the other transistor. This voltage difference is amplified and provided as the bandgap voltage.

In order for bandgap circuitry to generate the bandgap voltage, sufficient startup current is required to generate the voltage at the emitter of the BJT transistors. The requisite current needed to generate the bandgap voltage occurs when the supply voltage climbs to a predetermined voltage (e.g., 1.1 or 1.2 volts). Until the supply voltage reaches the predetermined voltage, the bandgap circuitry operates in its non-stable region and is unable to generate its bandgap voltage. However, when the supply voltage reaches the predetermined voltage, the bandgap circuitry operates at its stable operating region and provides the bandgap voltage as the reference voltage.

The circuitry of the present invention uses startup circuitry to provide current, in addition to the current provided by a source (e.g., $V_{CC}$) needed to activate the bandgap circuitry. That is, the startup circuitry enables the bandgap circuitry to operate in its non-stable operating region. To accomplish this, the startup circuitry selectively supplies current to one of the BJT transistors, the application of which causes the emitter voltage to rise. This increase in voltage activates a portion of the differential amplifier, which in turn activates a startup transistor that couples the bandgap circuit's reference node to the supply voltage (e.g., $V_{CC}$).

The bandgap circuitry initially clamps the reference node to the supply voltage until the supply voltage approaches the bandgap voltage, at which point, the bandgap circuitry ceases to follow the supply voltage and provides the bandgap voltage to the reference node. An advantage of the present invention is that the transition from the supply voltage to the bandgap voltage is smooth (i.e., voltage overshoot is minimal), whereas in prior art circuitry, the transition results in substantial overshoot.

The startup circuitry may be controlled by a FAST STARTUP signal generated by logic circuitry of the invention that determines when the state of the POWER-UP ENABLE signal changes. Specifically, the state of the FAST STARTUP signal may be the inverse of the POWER-UP ENABLE signal. Thus, when POWER-UP ENABLE is LOW, the FAST STARTUP signal is HIGH, which turns the startup circuitry ON. Similarly, when POWER-UP ENABLE goes HIGH, the fast startup circuitry is turned OFF. The ability to stop the supply of current being supplied to the aforementioned BJT transistor reduces current consumption (which is attributable to wasteful power consumption) and avoids potential interference with the operation of the bandgap circuitry when the supply voltage is HIGH.

The voltage detection circuitry can be used in power-down conditions, in addition to power-up conditions. During power-down, the voltage detection circuitry maintains the reference voltage at the bandgap voltage until the supply voltage drops below the voltage necessary for the bandgap circuitry to generate its bandgap voltage. When the supply voltage drops below the requisite voltage the startup circuitry may be activated so that the voltage detection circuitry tracks the supply voltage down to a power-off voltage. This way, the voltage detection circuitry provides some level of voltage as its reference voltage even when the supply voltage is too low to enable the bandgap circuitry to provide its bandgap voltage.

The voltage detection circuitry according to the invention may be adapted for use in systems that require power-up and/or power-down conditioning. For example, the voltage detection circuitry may used in connection with memory circuitry such as DRAM.

Further features of the invention, its nature and various advantages will be more apparent from the accompanying drawings on the following detailed descriptions.

DETAILED DESCRIPTION OF THE INVENTION

Figure 1:
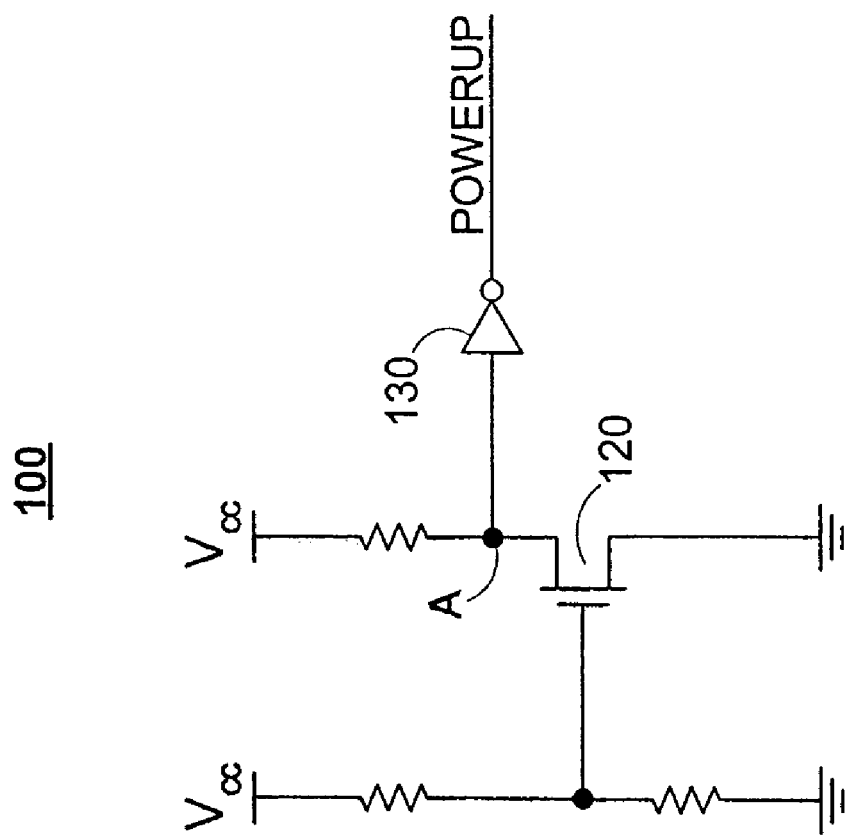
FIG. 1 is a simplified schematic diagram of prior art voltage detection circuitry.
Figure 2:
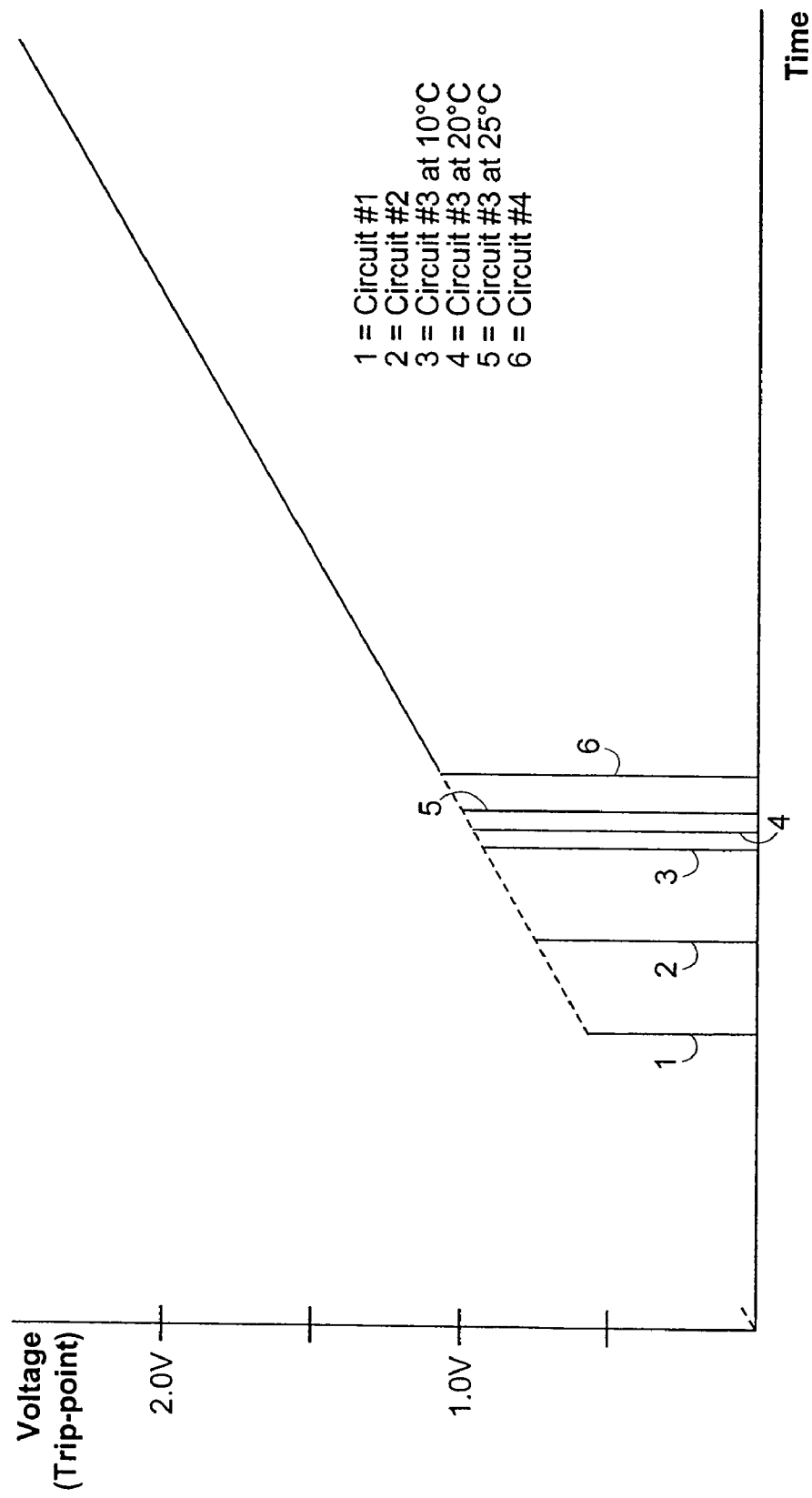
FIG. 2 shows a graph illustrating various trip-points obtained during the operation of voltage detection circuitry of FIG. 1.
Figure 3:
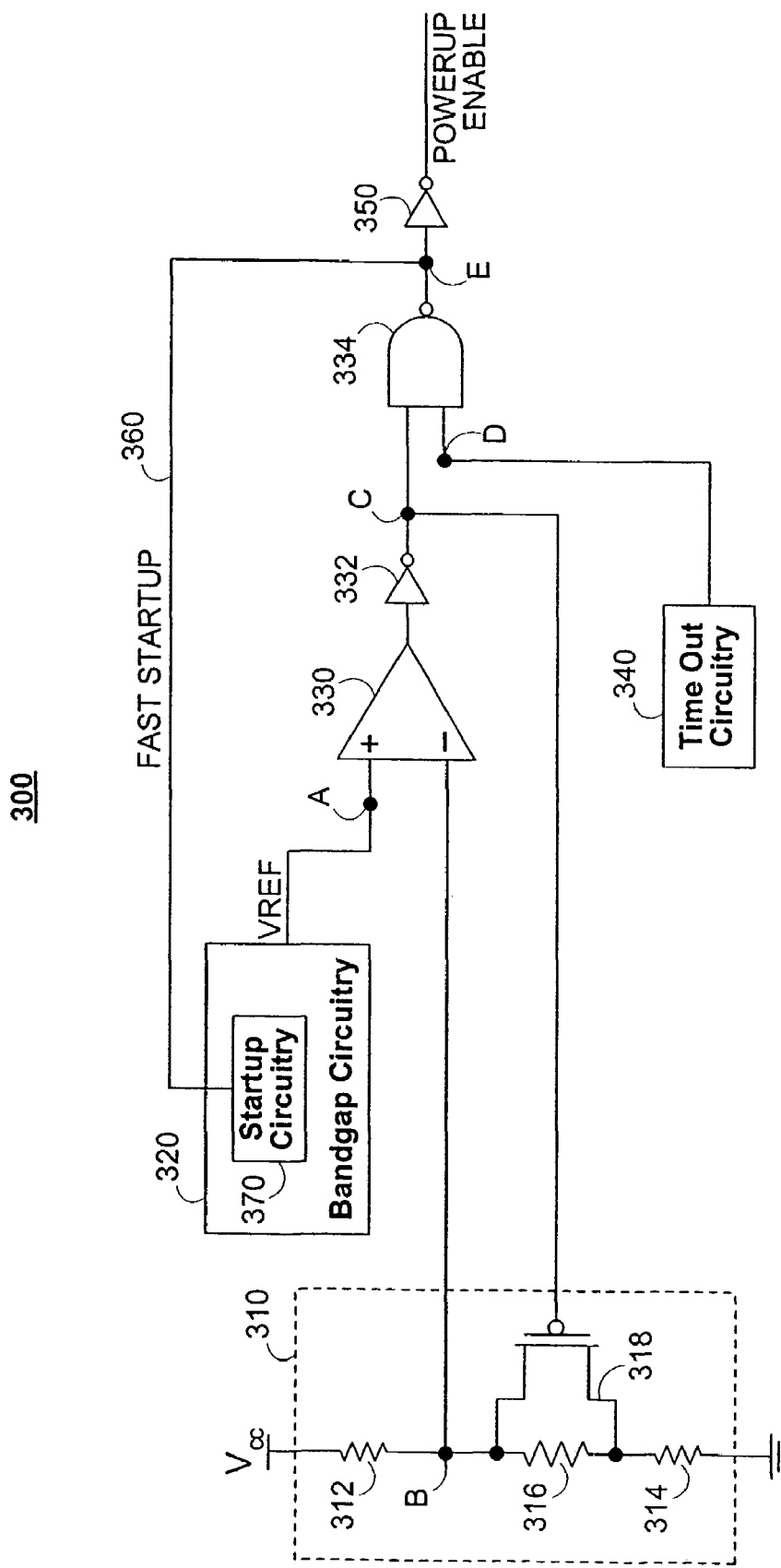
FIG. 3 is a simplified schematic diagram of voltage detection circuitry according to the invention.

FIG. 3 shows a simplified schematic diagram of voltage detection circuitry 300 according to the invention. Circuitry 300 includes voltage divider 310 that provides a predetermined ratio of $V_{CC}$ as an input voltage to the negative terminal of comparator 330. The predetermined ratio is defined by resistors 312, 314, and 316. As shown, the anode of resistor 312 is coupled to $V_{CC}$ and its cathode is coupled to the anode of resistor 316. The anode of resistor 314 is coupled to the cathode of resistor 316 and its cathode is coupled to ground. The input voltage is provided at the connection (Node B) between resistors 312 and 316.

Bandgap circuitry 320 is connected to the positive terminal (Node A) of comparator 330. The output of comparator 330 is connected to inverter 332. The output of inverter 332 (Node C) is connected to a first input of NAND gate 334 and to the gate of PMOS transistor 318. The source of PMOS transistor 318 is coupled to the anode of resistor 316 and its drain is connected to the cathode of resistor 316. Time out circuitry 340 is connected to a second input (Node D) of NAND gate 334. The output of NAND gate 334 is connected to inverter 350, which provides the POWER-UP ENABLE signal.

In general, bandgap circuitry 320 provides a reference voltage, $V_{REF}$, to Node A so that comparator 330 can compare $V_{REF}$ to the input voltage at Node B. The reference voltage provided by bandgap circuitry 320 may vary in voltage, initially following $V_{CC}$, from a power-off voltage (e.g., about 0 volts) to the bandgap voltage $V_{BG}$ (e.g., typically about 1.2 volts). The comparison performed by comparator circuitry determines whether the trip-point is triggered, at which point the state of POWER-UP ENABLE changes. For example, during ramp-up, the trip-point may occur when the voltage at Node B exceeds the voltage at Node A. During ramp-down, the trip-point may occur when the voltage at Node B equals or falls below the voltage at Node A.

Figure 4:
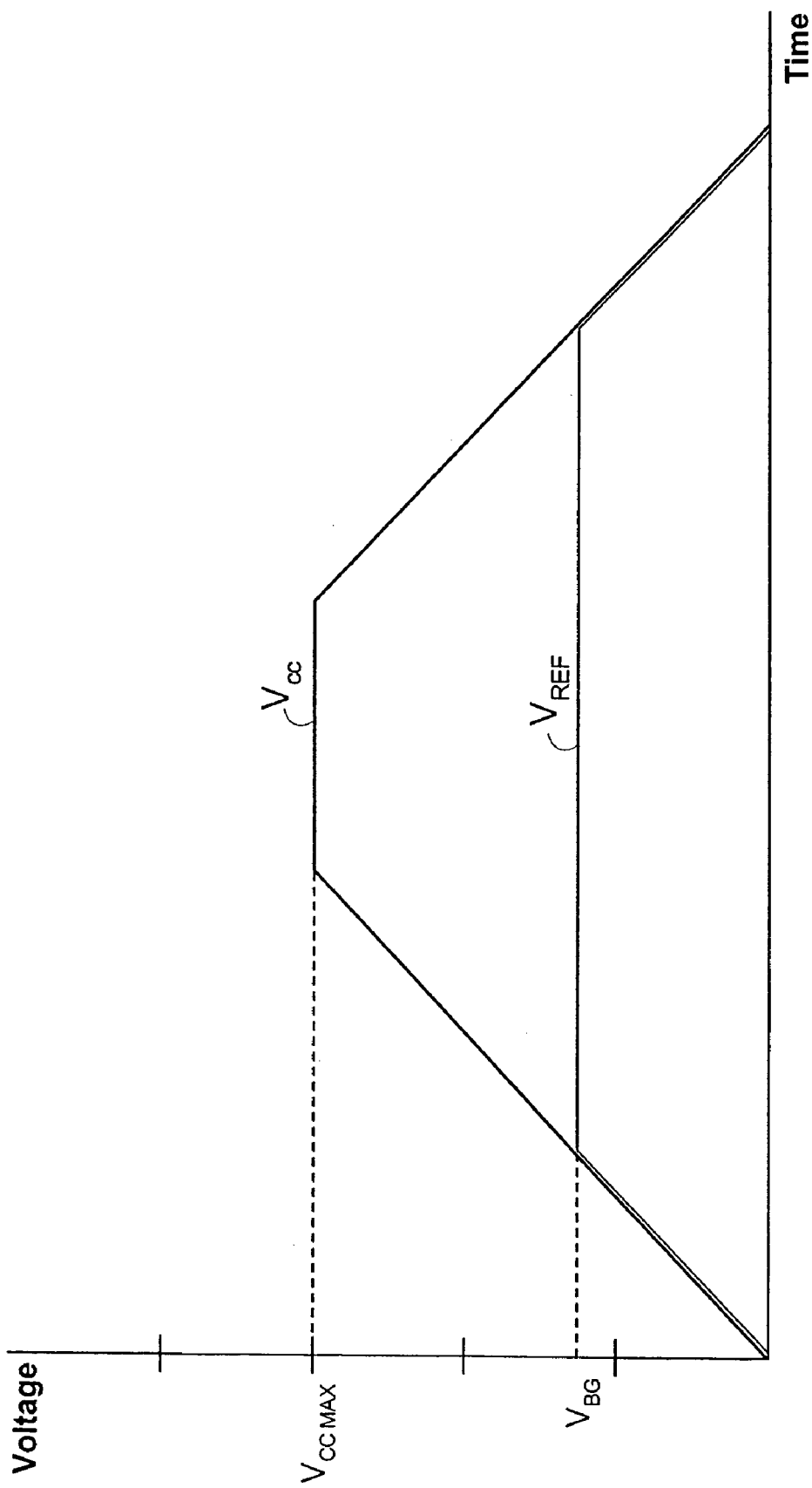
FIG. 4 is a graph showing the reference voltage being provided by the bandgap circuitry according to the invention.

The reference voltage being provided by bandgap circuitry 320 is now described in connection with FIG. 4, which is a graph of voltage versus time. FIG. 4 shows a voltage waveform of $V_{CC}$ that initially ramps up, remains constant, and then ramps down. FIG. 4 also shows a voltage waveform of the reference voltage $V_{REF}$, as provided by bandgap circuitry 320 in relation to $V_{CC}$.

When $V_{CC}$ is initially applied to circuitry 300, there is a phase during which bandgap circuitry 320 operates in its non-stable region. During this phase, bandgap circuitry 320 provides $V_{CC}$ as $V_{REF}$ to comparator 330. Bandgap circuitry 320 continues to supply $V_{CC}$ as $V_{REF}$ until sufficient voltage (e.g., 1.1 volts) enables bandgap circuitry 320 to transition to its stable operating region. Once in the stable operating region, bandgap circuitry 320 is able to generate a stable $V_{BG}$, thereby holding $V_{REF}$ to $V_{BG}$. When $V_{CC}$ ramps down, $V_{REF}$ is held at $V_{BG}$ until $V_{CC}$ drops to a voltage that causes bandgap circuitry 320 to revert to its non-stable operating region. At this point of reversion, $V_{REF}$ tracks $V_{CC}$.

Note that throughout ramp-up and ramp-down of $V_{CC}$, $V_{REF}$ does not substantially exceed $V_{BG}$. It is noted, however, that if $V_{REF}$ does exceed $V_{BG}$, its overshoot is negligible (i.e., on the order of 0.01 to 0.02 volts), as opposed to prior art bandgap circuits that overshoot $V_{BG}$ by as much as one to three volts. An advantage realized by preventing the $V_{REF}$ from substantially exceeding $V_{BG}$ is that it provides a substantially constant trip-point, thereby preventing unnecessary delays in triggering the trip-point. A delay occurs, for example, when the desired trip-point is reached (i.e., $V_{CC}$ has ramped up to a predetermined voltage), but $V_{REF}$ continues to track $V_{CC}$, thereby preventing comparator circuitry from registering the trip-point until $V_{REF}$ is brought down to $V_{BG}$.

A further advantage realized by tracking $V_{CC}$ until it reaches $V_{BG}$ is that it ensures that comparator 330 does not detect a voltage on Node B as being sufficient when in fact the voltage at Node B is actually insufficient to warrant driving POWER-UP ENABLE HIGH. This is achieved because the input voltage at Node B will be lower in voltage than $V_{REF}$ because the input voltage is reduced by a predetermined ratio (e.g., 90 percent) as defined by voltage divider 310.

The advantages realized by tracking $V_{CC}$ while at the same time preventing $V_{REF}$ from exceeding $V_{BG}$ are provided by startup circuitry 370. In general, startup circuitry 370 assists bandgap circuitry 320 by selectively supplying current to a BJT transistor being used to generate the bandgap voltage in connection with the operational amplifier. The application of this current assures that $V_{REF}$ is coupled to $V_{CC}$ substantially immediately at the start of power-up.

Referring back to FIG. 3, startup circuitry 370 may be coupled to bandgap circuitry 320 or may be included within bandgap circuitry 320. Startup circuitry 370 receives FAST STARTUP signal 360 from Node E. It is noted that the state of FAST STARTUP signal 360 is the inverse of the state of POWER-UP ENABLE. During power-up, FAST STARTUP signal 360 is HIGH because the time out circuitry 340 forces the output of NAND gate 334 HIGH for a predetermined period of time. This HIGH signal activates startup circuitry 370, thereby enabling it to assist bandgap circuitry 320. A more detailed discussion of the operation of startup circuitry 370 is discussed below in connection with FIG. 6.

Figure 5:
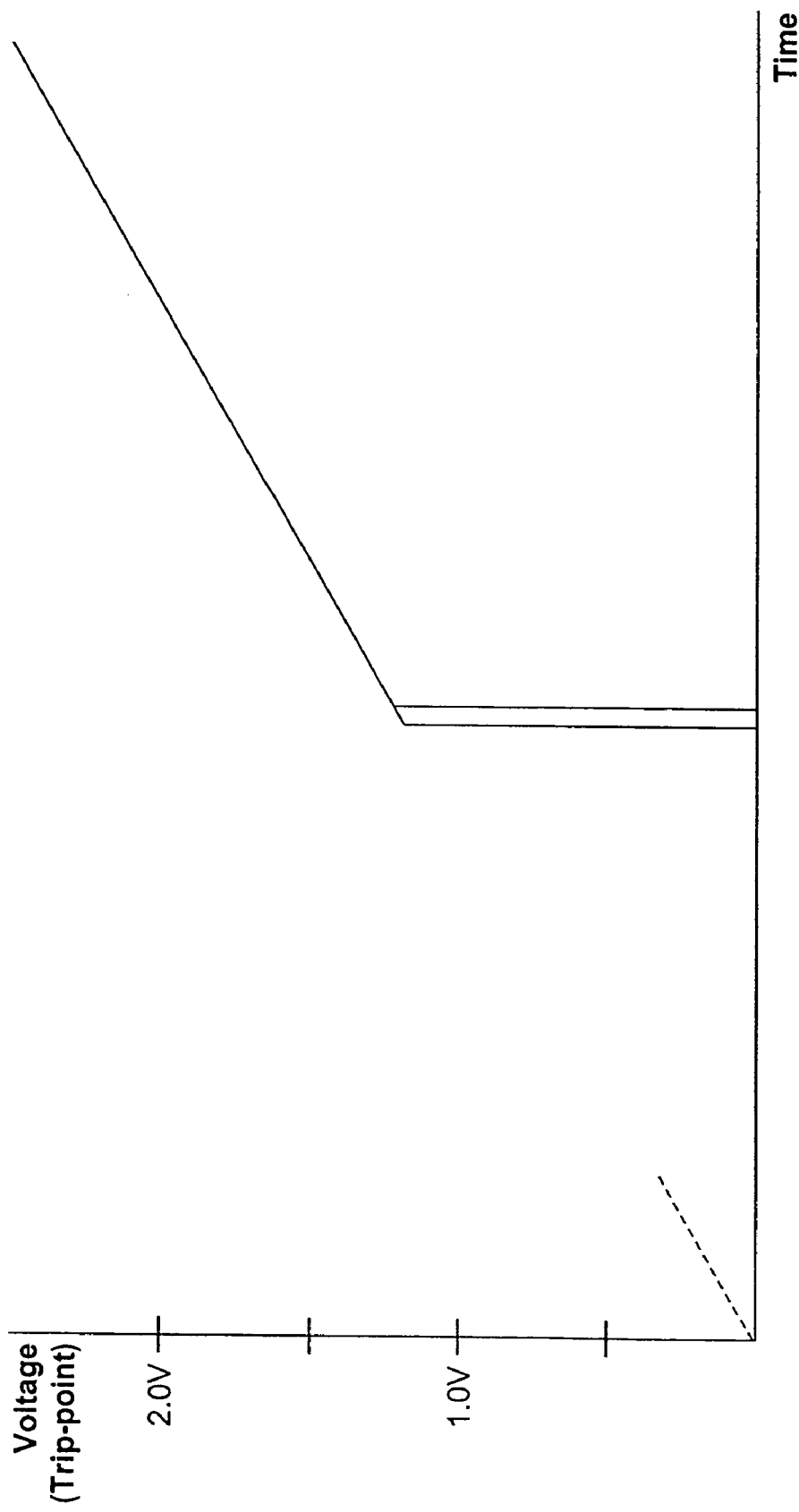
FIG. 5 shows a graph illustrating the trip-point obtained during operation of the voltage detection circuitry of FIG. 3 according to the invention.

In operation, circuitry 300 has a substantially constant trip-point, such as that shown in FIG. 5. FIG. 5 shows that the trip-point occurs when $V_{CC}$ is about 1.45 volts to 1.47 volts. It is understood that the trip-point can be set using a variety of different techniques. For example, the trip-point can be adjusted by changing the resistance values of resistors 312 and 314. The trip-point can be adjusted by inserting a gain stage between bandgap circuitry 320 and comparator circuitry 330. For example, a capacitor divider gain stage or an OPAMP based divider can be used to decrease the reference voltage. A low voltage reference may be useful for low voltage operation memory chips. A gain stage coupled with an amplifier can be used to increase the reference voltage.

Referring to FIGS. 3, 4, and 5 the operation of circuitry 300 is now described. Initially, at power-up, the voltage at $V_{CC}$ is at a power off voltage and POWER-UP ENABLE is LOW. In addition, time-out circuitry 340 provides a LOW signal to NAND gate 334 for a predetermined period of time (e.g., 5 μs). The LOW signal being applied to NAND gate 334 results in a HIGH output (because any LOW input to a NAND gate results in HIGH output). This HIGH signal is inverted by inverter 350 causing POWER-UP ENABLE to go LOW. Thus, POWER-UP ENABLE is prevented from going HIGH even if the voltage at Node B is sufficient to trigger the trip-point. Moreover, because the LOW signal is provided to NAND gate 334, this results in a HIGH signal being applied to FAST STARTUP 360. This HIGH signal activates startup circuitry 370, thereby coupling $V_{REF}$ to $V_{CC}$ at the start of power-up.

When the predetermined time period expires, time-out circuitry 340 provides a HIGH signal to NAND gate 334 until it is reset.

Initially at power up, the output of comparator 330 is HIGH because the input voltage is less than $V_{REF}$. This HIGH output signal is inverted by inverter 332, providing a LOW signal at Node C. This LOW signal activates PMOS transistor 318, shorting resistor 316. When resistor 316 is shorted, the voltage provided on Node B is determined by $V_{CC}$ and the resistance of resistors 312 and 314. Note that in the case where resistor 316 is shorted, the voltage at Node B will be lower than the case where resistor 316 is not shorted.

As discussed above, startup circuitry 370 has clamped $V_{REF}$ to $V_{CC}$. Thus, $V_{REF}$ follows $V_{CC}$ until bandgap circuitry enters into its stable operating region and couples $V_{REF}$ to $V_{BG}$. The output of comparator 330 goes LOW when the voltage at Node B exceeds $V_{REF}$. Note that the point in which the output of comparator 330 transitions from HIGH to LOW is a trip-point, as shown in FIG. 5. This LOW signal is inverted by inverter 332 and provided to NAND gate 334 as a HIGH input signal. In addition, this HIGH signal turns transistor 318 OFF. Assuming that time-out circuitry 340 has timed out, it provides a HIGH signal to the other input of NAND gate 340. Application of two HIGH inputs to NAND gate 334 results in a LOW output signal that turns startup circuitry 370 OFF (because FAST STARTUP 360 is LOW). This LOW signal is inverted by inverter 350 to drive POWER-UP ENABLE HIGH.

During power down, the output of comparator 330 changes from LOW to HIGH when the voltage at Node B equals or falls below $V_{REF}$. The HIGH signal is inverted by inverter 332, pulling Node C LOW. The LOW voltage at Node C turns PMOS transistor 318 ON, shorting resistor 316. The LOW voltage at Node C forces NAND gate 334 to output a HIGH signal that causes startup circuitry 370 to turn ON, pulling $V_{REF}$ to $V_{CC}$. Furthermore, the HIGH signal at the output of NAND gate 334 is inverted by inverter 350 to drive POWER-UP ENABLE LOW.

PMOS transistor 318 and resistor 316 are provided to take into account noise that may be present in $V_{CC}$. Noise may cause $V_{CC}$ to oscillate, potentially causing the output of comparator 330 to vacillate between HIGH and LOW. During startup, for example, transistor 318 is turned OFF and resistor 316 is no longer being shorted when POWER-UP ENABLE is asserted. This adds the resistance of resistor 316 to voltage divider 310, thereby causing the voltage on Node B to increase proportional to the added resistance. Increasing the voltage on Node B helps prevent the noise on $V_{CC}$ from inadvertently switching the output of comparator 330 back to HIGH, which would de-assert POWER-UP ENABLE.

Figure 6A:
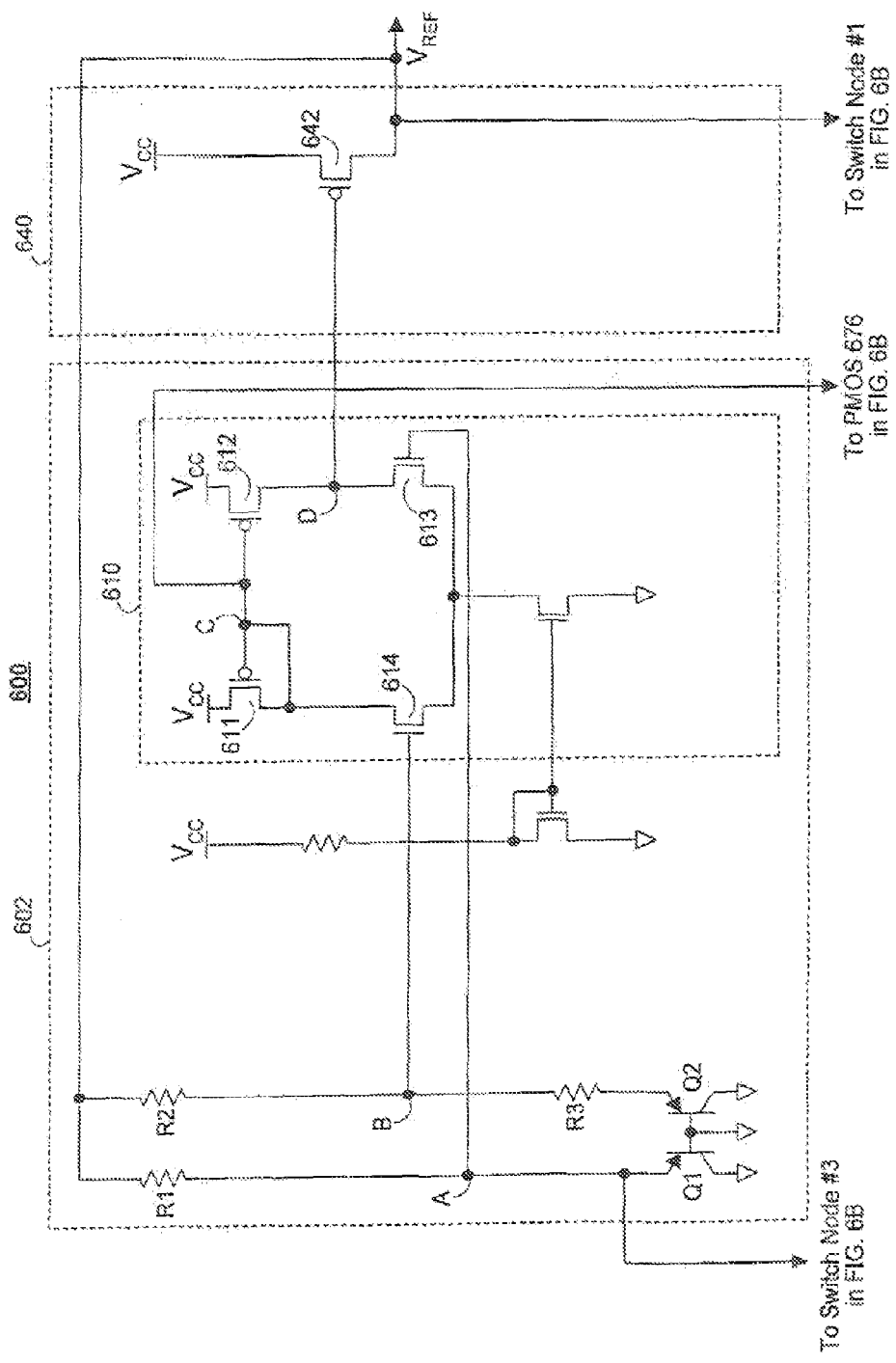
FIGS. 6A and 6B show a circuit diagram of the bandgap circuitry according to the invention.
Figure 6B:
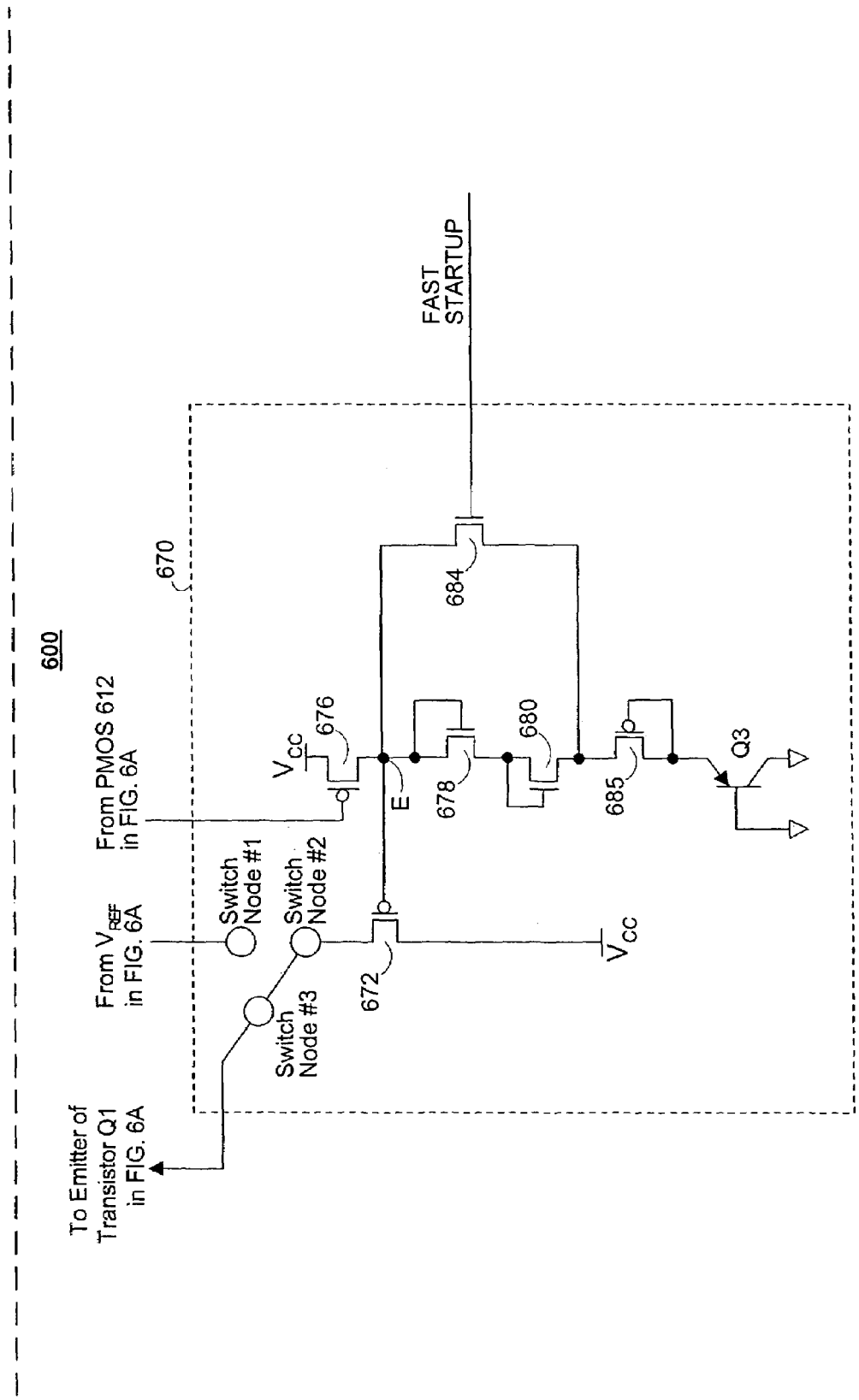

FIGS. 6A and 6B show a transistor diagram of bandgap circuitry 600 according to the invention. The large dashed lines shown in-both FIGS. indicate how the two FIGS. should be aligned with respect to each other. Thus, by aligning the dashed lines it is seen that FIG. 6A represents an upper portion of circuitry 600 and FIG. 6B represents a lower portion of circuitry 600. Note that hereinafter FIGS. 6A and 6B are referred to collectively herein as FIG. 6.

General regions of circuitry 600 are delineated by dashed boxes 602, 640, and 670 to facilitate the description of an embodiment of the invention. Box 602 generally refers to the operational amplifier portion of circuitry, box 640 generally refers to the driving portion of circuitry 600, and box 670 generally refers to the current source portion of circuitry 600. It is understood that the groupings are merely illustrative and are not limiting. For example, the startup circuitry according to the invention may be collectively represented by both boxes 640 and 670. In another example, operational amplifier may include both boxes 602 and 640.

The operational amplifier portion, as delineated by box 602, includes PNP BJT transistors Q1 and Q2, resistors R1, R2, and R3, and differential amplifier 610. The operation of operational amplifiers is well known in the art and need not be discussed in detail here. The relevant operable portions of the operational amplifier will become apparent in the following discussion. However, it is now worth noting that Node A, which is formed between the emitter of transistor Q1 and resistor R1, is coupled to SWITCH NODE #3. Furthermore, Node C, which is formed between the gates of PMOS transistors 611 and 612, is coupled to the gate of PMOS transistor 676.

Box 640, which may form part of the startup circuitry according to the invention, includes circuitry that is operable to selectively couple $V_{REF}$ to $V_{CC}$. Box 640 includes PMOS transistor 642 having its source coupled to $V_{CC}$, its gate coupled to Node D, which is formed between the drain of PMOS transistor 612 and the drain of NMOS transistor 613, and its drain coupled to $V_{REF}$. $V_{REF}$ may be coupled to SWITCH NODE #1.

Box 670, which may form part of startup circuitry according to the invention, includes circuitry that is operative to selectively provide current to the emitter of BJT transistor Q1 (Node A). Box 670 includes PMOS transistor 672 having its drain coupled to SWITCH NODE #2, its source coupled to $V_{CC}$, and its gate coupled to Node E, which is formed between the drain of PMOS transistor 676 and the drain of NMOS transistor 678.

SWITCH NODE #2 is shown in FIG. 6 connected to SWITCH NODE #3, effectively coupling the drain of transistor 672 to Node A. It is noted that SWITCH NODE #2 can be connected to SWITCH NODE #1 to enable circuitry 600 to operate in a different mode.

The source of PMOS transistor 676 is coupled to $V_{CC}$ and its drain is coupled to the drain of NMOS transistor 678. The gate of NMOS transistor 678 is coupled to Node E and to the drain of NMOS transistor 684. The source of NMOS transistor 678 is coupled to the gate and drain of NMOS transistor 680. The source of NMOS transistor 680 is coupled to the source of PMOS transistor 685 and the source of NMOS transistor 684. NMOS transistor 684 has its gate coupled to receive FAST STARTUP signal 360 (of FIG. 3). The gate and drain of PMOS transistor 685 are connected to PNP BJT transistor Q3.

Figure 7:
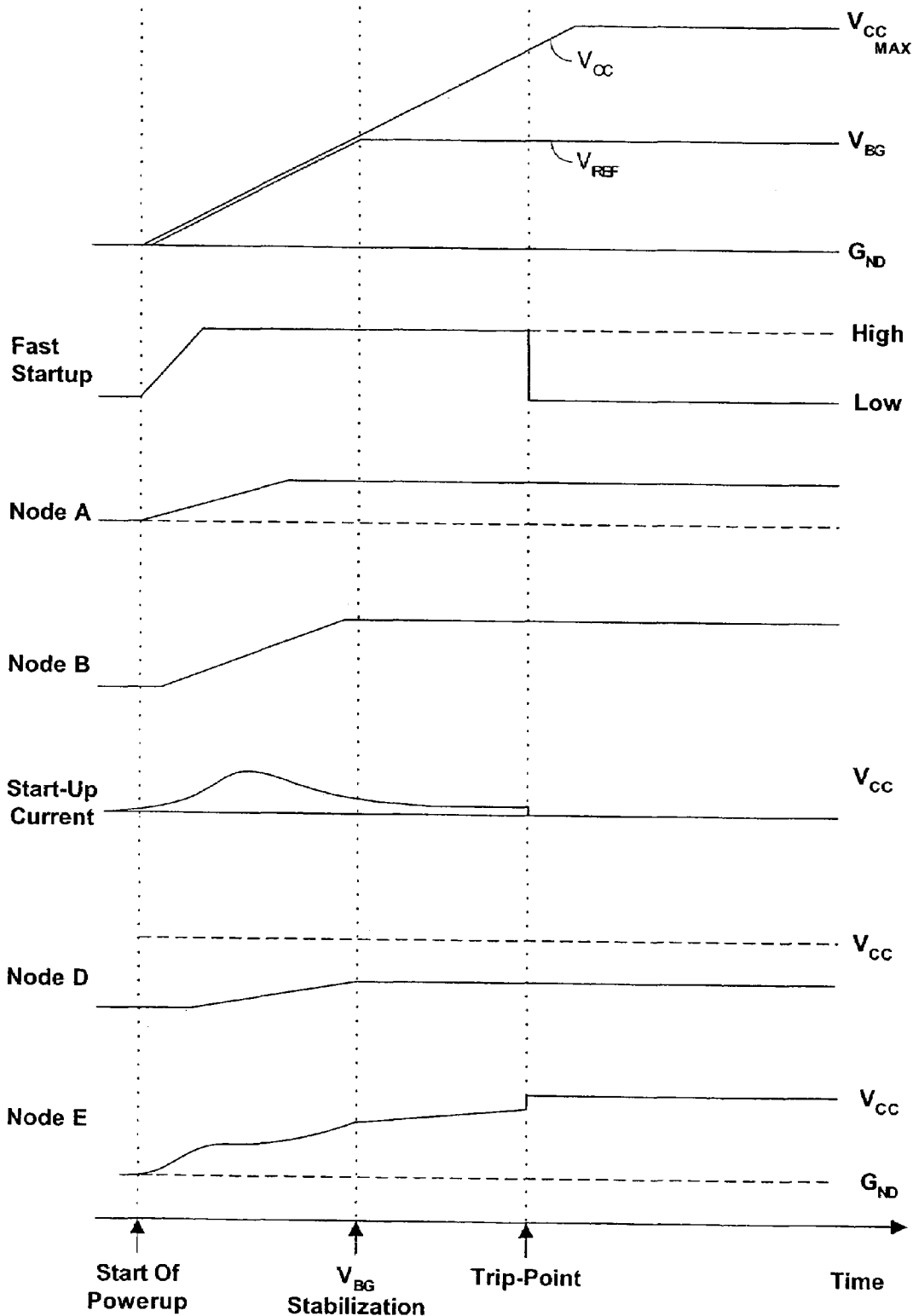
FIG. 7 is a timing diagram of different modes of operation of the circuitry in FIG. 6 according to the invention.

With reference to circuitry 600 of FIG. 6 and the timing diagram of FIG. 7 the operation of circuitry 600 will now be described. Before power-up, transistors 611, 612, 613, 614, and 676 are biased to be turned OFF, the voltage at $V_{REF}$ is equal to power off voltage (or ground), and the start-up current is nil.

At the start of power-up FAST STARTUP goes HIGH, causing transistor 684 to turn ON. When transistor 684 is ON, this short-circuits transistors 678 and 680, thereby coupling Node E to transistor 685. This coupling results in the application of a voltage, provided by the combination of transistors 685 and Q3, to Node E. When transistor 684 is ON, the voltage at Node E is kept at a voltage level that is sufficiently LOW enough to ensure that transistor 672 is ON, or at least partially ON.

When transistor 672 is ON (in this case partially ON), current from $V_{CC}$ flows through transistor 672 to the emitter of transistor Q1. This current provides more startup current to transistor Q1 than it would receive in the absence of startup circuitry 670 according the invention. This increase in current causes the voltage at Node A to rise, resulting in the activation of NMOS transistor 613. When transistor 613 turns ON, the voltage at Node D is pulled to ground (at least temporarily), which causes transistor 642 (e.g., a startup transistor) to turn ON, thereby coupling $V_{REF}$ to $V_{CC}$. It is understood that the current being supplied to BJT transistor Q1 occurs substantially immediately after power up is initiated, providing immediate $V_{CC}$ tracking.

As $V_{REF}$ is pulled up by $V_{CC}$, the voltage at Nodes A and B are pulled up via resistors R1 and R2, respectively. Initially, during startup, the voltage on Node A is higher than the voltage on Node B. This voltage differential causes the operational amplifier to operate in its non-stable region. The voltages on Nodes A and B equalize as $V_{REF}$ is pulled to a voltage that approaches the bandgap voltage (e.g., about 1.2 volts) of circuitry 600. Once Nodes A and B are equal or substantially equal, this causes the voltages at Nodes C and D to be equal or substantially equal, thereby turning transistors 611, 612, and 676 ON.

When transistor 676 is turned ON, the voltage at the gate of transistor 672 (Node E) increases to nearly $V_{CC}$, causing transistor 672 to be slightly turned off. As $V_{CC}$ rises, the current being driven to the emitter of BJT transistor Q1 decreases, thereby further assisting the operational amplifier in generating its bandgap voltage. Specifically, decreasing the current flow to BJT transistor Q1 helps to further equalize the voltage on Nodes A and B because the additional startup current is no longer needed to activate circuitry 600.

When the trip-point is triggered, FAST STARTUP goes LOW, thereby turning transistor 684 OFF. At this point, transistors 678 and 680, which are no longer being short-circuited, assist in maintaining the voltage at Node E at $V_{CC}$ to minimize start-up current. As a result, the voltage at Node E is driven to a voltage that results in turning transistor 672 completely OFF. Once OFF, current no longer flows through transistor 672 to the emitter of BJT transistor Q1, thereby reducing current consumption and avoiding potential interference with the operation of the bandgap circuitry.

It will be understood that the foregoing drain and source orientation and emitter and collector orientation of the transistors described herein is not intended to be limiting, but merely illustrative of one way such transistors can be constructed. Therefore, the terms "source," "drain," "emitter," and "collector" are to be interpreted in their broadest sense.

Figure 8:
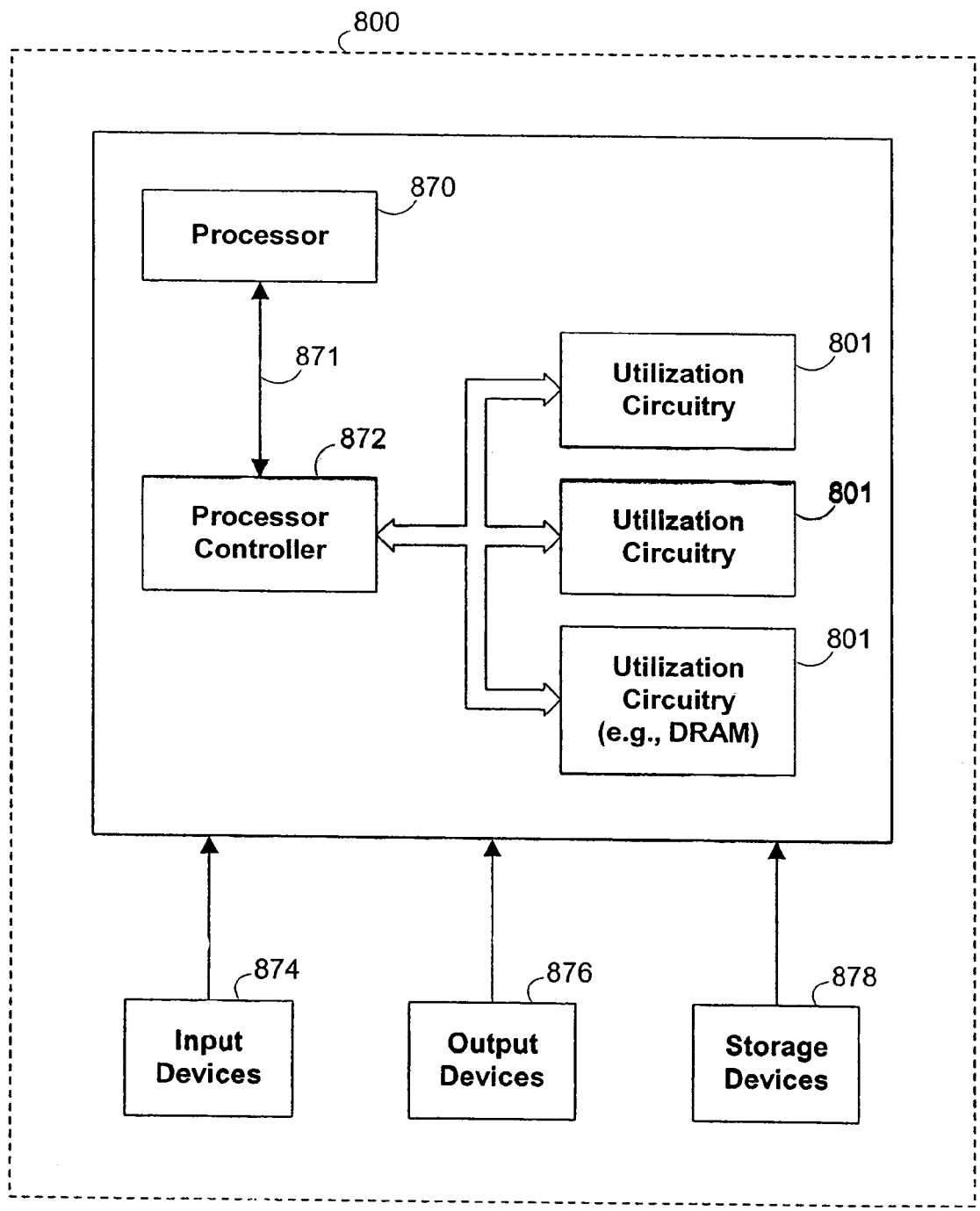
FIG. 8 is an illustrative block diagram of a system that incorporates the invention.

FIG. 8 shows a system that incorporates the invention. System 800 includes a plurality of utilization circuitry 801 (e.g., DRAM), a processor 870, a memory controller 872, input devices 874, output devices 876, and optional storage devices 878. Voltage detection circuitry according to the invention may be used, for example, to enable utilization circuitry 801, processor 870, or memory controller 872. For example, DRAM circuitry (not shown) may be enabled by voltage detection circuitry according to the invention to prevent the DRAM circuitry from operating (e.g., perform read and write functions) if the supply voltage is below a predetermined voltage. Data and control signals are transferred between processor 870 and memory controller 872 via bus 871. Similarly, data and control signals are transferred between memory controller 872 and utilization circuitry chips 801 via bus 873. Input devices 874 can include, for example, a keyboard, a mouse, a touch-pad display screen, or any other appropriate device that allows a user to enter information into system 800. Output devices 876 can include, for example, a video display unit, a printer, or any other appropriate device capable of providing output data to a user. Note that input devices 874 and output devices 876 can alternatively be a single input/output device. Storage devices 878 can include, for example, one or more disk or tape drives.

Thus, power-up detection circuitry that operates with a substantially constant trip-point is provided. One skilled in the art will appreciate that the present invention can be practiced by other than the described embodiments, which are presented for the purposes of illustration and not of limitation, and the present invention is limited only by the claims which follow.

What is claimed is:

1. Power detection circuitry, comprising:

voltage reference circuitry coupled to a source voltage and operative to provide to a reference node a reference voltage ranging from a power-off voltage level to a fixed voltage level, said voltage reference circuitry operative to:

selectively provide said source voltage or said fixed voltage to said reference node;

logic circuitry coupled to receive said reference voltage and an input voltage derived from said source voltage, said logic circuitry operative to selectively change the state of a POWER-UP ENABLE signal based on said reference voltage and said input voltage; and time-out circuitry coupled to said logic circuitry and operative to prevent said POWER-UP ENABLE signal from going HIGH for a predetermined period of time.

2. The circuitry defined in 1, wherein said reference circuitry comprises voltage divider circuitry coupled to said source voltage and to said logic circuitry and operative to provide said input voltage.

3. The circuitry defined in claim 1, wherein said reference circuitry is operational amplifier bandgap circuitry and said fixed voltage level is the bandgap voltage of said bandgap circuitry.

4. The circuitry defined in claim 1, wherein said reference circuitry and said logic circuitry are operative to provide a substantially constant trip-point.

5. The circuitry of claim 1, further comprising:

startup circuitry coupled to said reference circuitry and operative to cause said reference circuitry to provide said source voltage to the reference node until said source voltage approaches said fixed voltage.

6. The circuitry defined in claim 1, wherein said reference circuitry is operative to prevent the voltage being applied to said reference node from exceeding said fixed voltage.

7. The circuitry defined in claim 6, wherein the voltage being applied to said reference node does not exceed said fixed voltage by more than 0.02 volts.

8. A method for determining a power-up enable condition using circuitry that provides a signal to an output node, the method comprising:

receiving a source signal that changes in magnitude during startup from a minimum signal level to a maximum signal level;

providing said source signal to the output node substantially immediately after commencement of startup; and when the source signal magnitude reaches a predetermined magnitude and after a predetermined period of time, using said circuitry to provide a signal of said predetermined magnitude to said output node.

9. The method defined in claim 8 further comprising:

preventing the magnitude of the signal provided to said output node from substantially exceeding said predetermined magnitude.

10. The method defined in claim 8 further comprising:

comparing the magnitude of said signal provided to said output node to an input signal magnitude derived from said source signal.

11. The method defined in claim 10, further comprising:

determining whether to assert a POWER-UP ENABLE signal based on the comparison of said input signal magnitude and the magnitude of the signal provided to said output node.

12. The method defined in claim 8, wherein said signal of predetermined magnitude is a bandgap voltage generated by operational amplifier based bandgap circuitry.

13. A method, comprising:

receiving a source voltage;

selectively providing the source voltage or a substantially constant reference voltage to a reference node;

comparing the voltage at said reference node to an input voltage derived from said source voltage to determine whether to change the state of a POWER-UP enable signal; and waiting a predetermined period of time before changing the state of a POWER-UP enable signal.

* * * * *

UNITED STATES PATENT AND TRADEMARK OFFICE
CERTIFICATE OF CORRECTION

| | |
|---|---|
| PATENT NO. | : 7,332,946 B2 |
| APPLICATION NO. | : 11/501673 |
| DATED | : February 19, 2008 |
| INVENTOR(S) | : Pan et al. |

It is certified that error appears in the above-identified patent and that said Letters Patent is hereby corrected as shown below:

In column 9, line 23, in Claim 2, delete "1," and insert -- claim 1, --, therefor.

In column 10, line 1, in Claim 8, delete "power-up enable" and insert --POWER-UP ENABLE --, therefor.

In column 10, line 39, in Claim 13, delete "enable" and insert -- ENABLE --, therefor.

In column 10, line 42, in Claim 13, delete "enable" and insert -- ENABLE --, therefor.

Signed and Sealed this

Tenth Day of June, 2008

JON W. DUDAS
*Director of the United States Patent and Trademark Office*